United States Patent
Kawamura et al.

(10) Patent No.: US 7,157,193 B2
(45) Date of Patent: Jan. 2, 2007

(54) IMAGE FORMING MATERIAL, COLOR FILTER MASTER PLATE, AND COLOR FILTER

(75) Inventors: Koichi Kawamura, Shizuoka-ken (JP); Sumiaki Yamasaki, Shizuoka-ken (JP); Nobuo Suzuki, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 108 days.

(21) Appl. No.: 10/173,299

(22) Filed: Jun. 18, 2002

(65) Prior Publication Data
US 2003/0008223 A1    Jan. 9, 2003

(30) Foreign Application Priority Data

Jun. 19, 2001  (JP)  ............................. 2001-184577
Jun. 20, 2001  (JP)  ............................. 2001-187244

(51) Int. Cl.
G02B 5/20  (2006.01)
(52) U.S. Cl. .......................................................... 430/7
(58) Field of Classification Search .................... 430/7, 430/270.1, 292, 945
See application file for complete search history.

(56) References Cited

U.S. PATENT DOCUMENTS 5,716,740 A * 2/1998 Shiba et al. ................... 430/7
5,935,741 A   8/1999 Kim et al.
5,989,757 A   11/1999 Satoi

FOREIGN PATENT DOCUMENTS

| EP | 0 523 245 A1 | 1/1993 |
| EP | 0 821 275 A2 | 1/1998 |
| EP | 0 932 081 A1 | 7/1999 |
| EP | 1 075 942 A2 | 2/2001 |
| EP | 1 235 105 A2 | 8/2002 |

OTHER PUBLICATIONS

Search Report issued in European Patent Application No. 02 01 3498 on Aug. 29, 2003.

* cited by examiner

*Primary Examiner*—John A. McPherson
(74) *Attorney, Agent, or Firm*—Buchanan Ingersoll & Rooney PC

(57) ABSTRACT

An image recording material provided with an image recording layer including a polymer compound which contains a functional group with a hydrophilic/hydrophobic character thereof being changeable by heat, acid, or irradiation and which is directly chemically bonded to the substrate, wherein the image recording layer is heated, treated with acid, or irradiated to change the hydrophilic/hydrophobic character of a surface of the image recording layer and organic or inorganic molecules for forming a visible image are adsorbed at regions thereof where the hydrophilic/hydrophobic character has been changed.

7 Claims, No Drawings

IMAGE FORMING MATERIAL, COLOR FILTER MASTER PLATE, AND COLOR FILTER

BACKGROUND OF THE INVENTION

1. Field of the Invention

The present invention relates to an image forming material, particularly an image forming material on which an image can be easily formed with a high resolution and which is useful as a display material and a pattern formation material, to a color filter master plate suitable for application to a staining method for producing a color filter to be employed in a liquid crystal display device or a solid imaging device and, to a color filter as well.

2. Description of the Related Art

Conventionally, a variety of images forming materials have been used as display materials and pattern forming materials. In general, when they are used for carrying out image formation, a material, e.g., a colored material such as an ink, is imagewise deposited on the surface of a white image receiving material such as a paper medium, or a material, e.g., a nontransparent material such as a pigment, is imagewise deposited on a transparent image receiving material such as a plastic film.

The image formation is carried out by a variety of methods, e.g., by depositing an ink on the image receiving material by inkjet printing, by imagewise coloring a dye precursor by heating a heat-sensitive recording material used for printing by electrostatically causing a colored material to adhere to a surface of the image receiving material and then thermally fixing the material, typically by a copying machine, or the like.

Also, as a method for forming a dense and precise pattern with controlled orientation, for example, Japanese Patent Application Laid-Open (JP-A) No. 2000-247799 proposes a method for producing a functional organic molecular thin film. Dense and precise patterns can be formed according to the method, but in order to write an image pattern, UV exposure through a mask, such as a lithographic film, is required just as in a conventional image forming method using a lithographic printing plate. The process is thus a complicated image forming method.

Further, it is difficult to form an image with a high resolution on an image receiving material with a large surface area or to form an image with a high density on thin-film image receiving material by conventional and general image forming methods.

On the other hand, a variety of methods for forming images directly on image receiving materials from digitized image data without using a medium such as a lithographic film have been recently proposed and have received attention.

While there is an expectation that by employing such digitized image forming methods, it will be possible to form a clear image irrespective of surface area and properties of an image receiving material. No technology capable of stably fixing a nontransparent material or a dye on a desired image receiving material based on the digitized data has been established as of yet.

Next, there are various known methods for producing color filter to be employed in liquid crystal display devices and solid imaging devices including a staining method, an electrodeposition method, a printing method, a pigment dispersing method and the like.

In the staining method a color filter is produced by staining a staining substrate made of natural resin such as gelatin, glue, casein or the like, or synthetic resin such as amine-modified polyvinyl alcohol or the like.

In the electrodeposition method a color filter is produced by forming a predetermined pattern of transparent electrodes and then forming a color image based on the pattern by ionizing resin containing a pigment dissolved or dispersed in a solvent by application of a voltage.

The electrodeposition method requires a photolithographic process which includes a step for forming a film of transparent electrodes for forming the color filter, aside from other than the transparent electrodes for displaying, and an etching step. If a short circuit occurs in that case, line defects are generated resulting in a decrease in production yield. Further, there are problems with this method in that, theoretically, it is difficult to apply the method to, for example, a mosaic arrangement other than a stripe arrangement and the transparent electrodes are difficult to control.

The printing method is a simple method for producing a color filter by printing, such as offset printing, using an ink containing a pigment dispersed in a heat-hardenable resin or a UV-hardenable resin. Since a suitable ink has a high viscosity, filtering is difficult to carry out and defects easily appear in portions where dust or foreign substances are present or where an ink binder causes gelling. There are also problems with respect to printing precision, positioning precision, line width precision, and plane smoothness.

In the pigment dispersion method is a color filter is produced by a photolithographic method using coloring and irradiation sensitive compositions containing pigments dispersed in a variety of photosensitive compositions. This method is suitable for producing a color filter for a large surface with very fine color display since the obtained color filter is stable with respect to light and heat due to use of a pigment and since it has high positioning precision due to patterning by the photolithographic method, and currently, continues to be in the main stream of color filter production methods.

Recently, along with progress toward further fineness, power efficiency of back lights, and a high brightness in a liquid crystal display devices, there is a desire to achieve a higher transmittance and higher contrast for color filters. In the pigment dispersion method, it is essential to make the pigment fine in order to achieve high fineness in the display device, but new problems arise with the achievement of greater fineness including an increase in viscosity of a dispersion and precipitation of the pigment due to aggregation.

JP-A No. 8-6242 discloses a new method requiring no pigment dispersion and carried out by forming an image with dye, which is a molecule dispersion type pigment precursor (latent pigment), and then converting the pigment precursor to a pigment by a chemical method, a thermal method, or a photodecomposition method.

The method is unsatisfactory in that the conversion to the pigment by the chemical method, the thermal method, or the photodecomposition method is insufficient and that the intrinsic properties of the dye are lost due to the conversion. In particular, since a degree of conversion to the pigment differs depending on temperature, there is a problem in that coloring with different hues results depending on a heating temperature, and accordingly, no color filter with sufficiently practical hue stabilization has been obtained as of yet.

In the case of solid imaging devices such as CCD and C-MOS, it has become clear that roughness due to pigment dispersion, which has not been a problem before, affects the performance. With the pigment dispersion method having the above-described problem, and the staining method, using a dye, has received attention recently.

The staining method is a method for producing a color filter by staining a staining substrate comprising a thin film of natural resin such as transparent gelatin, glue, casein or the like, or synthetic resin such as amine-modified polyvinyl alcohol or the like, in a stripe- or mosaic-like pattern (hereinafter referred as to a pattern) with a dye on the surface of a substrate comprising glass or silicone wafer.

The following three methods are known for producing a color filter by staining.

(1) A coloring layer is formed by providing a coating film to be colored on a surface of a substrate, forming a pattern by exposure and development through a mask, and then staining the obtained pattern. After that, a non-colored protective film is formed on the entire surface of the coloring layer and by a similar procedure to that described above, a second coating film to be colored is further formed thereon.

Following that, coloring layers are successively layered as necessary to form coloring layers of the three primary colors, R (red), G (green), and B (blue), of the primary color system or the three primary colors, Y (yellow), M (magenta), and C (cyan) of the complementary color system. In this case, since protective films are disposed on the surface of the respective coloring layers, the filters for the respective colors are not formed in a single plane and thus steps are formed.

(2) A coloring portion is formed by providing a coating film to be colored on a surface of a substrate, forming a positive resist layer thereon, forming a pattern by exposure and development through a mask, staining the coating layer, and separating the positive resist layer. After that, the steps of forming a positive resist layer and successive steps are repeated to separately stain the single coating layer in desired patterns with a plurality of colors.

(3) After a coating film to be colored is formed on a surface of a substrate, patterns formed by exposure and development through a mask are stained to form a coloring layer, and then fixation and stain-preventive treatment is carried out with tannic acid. A second coating to be colored is then formed in a similar manner. Successively, additional coloring layers are formed on the surface of the same substrate.

In the method (1), protective films are required and therefore the coloring layers composing the color filter cannot be formed on a single plane. By the methods (2) and (3), although the respective coloring layers can be formed on a single plane, coating films to be colored and the positive resist have to be applied a plurality of times.

Also, with of these methods, the steps are complicated and rather many steps are required to complete the color filters.

As described above, along with increased demand for higher pixels densities, there is a desire for a color filter which is more easily produced with excellent properties which conventional color filter do not have.

SUMMARY OF THE INVENTION

In light of the above-described disadvantages of the conventional technology, an object of the present invention is to provide an image forming material applicable to a wide range of fields and which is capable of forming an image with high sensitivity by exposure or heating, providing an image with high resolution and sharpness irrespective of a surface area thereof, and directly forming an image based on digital data using an infrared laser or the like.

Another object of the present invention is to provide a color filter master plate capable of forming pixels, a black matrix, or other patterns, having fineness and even hue and easily forming a color filter having a multi-color constitution in a single plane, that is, constructed as an even thin film. Yet another object of the present invention is to provide a color filter having fine pixels with a plurality of uniform hues, and further having a black matrix in a single plane, using such a color filter master plate.

Based on enthusiastic investigations, the inventors of the present invention have found that the above-described objects can be achieved by utilizing a polymer compound whose surface properties change by exposure, heating and infrared laser irradiation, which led them to complete the present invention.

A first aspect of the present invention provides an image forming material comprising a substrate having disposed thereon and directly chemically bonded thereto an image recording layer including a polymer compound containing a functional group with a hydrophilic/hydrophobic character thereof being changeable by heat, acid, or irradiation, wherein the image recording layer is heated, treated with acid, or irradiated to change the hydrophilic/hydrophobic character of a surface thereof and organic or inorganic molecules are adsorbed at regions thereof where the hydrophilic/hydrophobic character has been changed.

It is preferable that the polymer compound, which is used the image recording layer, which has a functional group with a hydrophilic/hydrophobic character changeable by heat, acid, or irradiation, and which is directly chemically bondable to the substrate, is a straight chain polymer compound bonded to the surface of the substrate directly by chemical bonding at the terminal of the polymer chain or a straight chain polymer compound bonded to the surface of the substrate by chemical bonding via a main chain polymer compound at the terminal of the polymer chain. The chemical bonding is preferably carbon-carbon covalent.

A nontransparent material and a dye for forming a visible image are preferably selected from organic or inorganic dyes and pigments due to the ease with which they are obtained.

The image forming material of the present invention is capable of providing an image with high resolution based on digital data irrespective of a surface area of the image forming material, since image formation is carried out by selectively causing organic or inorganic molecules to be adsorbed in regions subjected to irradiation, including exposure, or heated regions corresponding to the polarity of the surface of the polymer compound which contains the functional group (hereinafter, properly referred as to a polarity conversion group) having a hydrophilic/hydrophobic character changeable by heat, acid, or irradiation being applied to the surface.

The polymer compound having the polarity conversion group to be employed in the image recording layer of the image forming material, for example, is bonded to a substrate directly or through a main chain polymer compound at the terminal and is firmly adsorbed in the surface of the recording layer in an ionic manner depending on a polarity of the organic or inorganic molecules for formation of visible patterns, so that both an image region and a non-image region have high strength and wear resistance. As a result, even if the recording layer is thin, a high strength image can be formed, and if a dye is used as the organic molecules or a variety of pigments are used as the inorganic molecules, are adsorbed to the polarity conversion group in an ionic manner and the adsorbed molecules are firmly fixed in approximately a mono-molecular film state, so that possible to form an image with a high density and excellent sharpness even when using a thin film. Further, in the present invention, the polarity conversion group, which has adsorptivity with respect to the organic or inorganic molecules, has a graft chain structure with a high mobility, so that as compared with molecule adsorption by a general cross-linked polymer film, an adsorption speed is extremely high and the amount of the molecules adsorptive per unit of surface area is increased. In the image forming material of the present invention, it is possible to further improve sensitivity and make the image recording layer thin while maintaining the image quality. At the same time since the polymer compound composing the image recording layer is directly chemically bonded to the substrate (image receiving material), the image recording layer is excellent in durability even if it is a thin layer.

A second aspect of the present invention provides a color filter master plate comprising a recording layer containing a polymer compound including a functional group with a hydrophilic/hydrophobic character thereof being changeable by heat, acid, or irradiation.

It is preferable in the color filter master plate of the present invention, that the recording layer, which contains the polymer compound having the functional group with a hydrophilic/hydrophobic character changeable by heat, acid, or irradiation, is disposed on a substrate and bonded directly or via a lower layer to the substrate by chemical bonding.

The polymer compound is a straight chain polymer compound bonded to the substrate surface directly or via a lower layer by chemical bonding either at the terminal of the polymer chain thereof or via a main chain polymer compound at the terminal of the polymer chain thereof.

Further, the color filter of the present invention is obtained by changing the hydrophilic/hydrophobic character of a surface of the image recording layer by applying heat or irradiation to the color filter and causing a dye or a pigment to be adsorbed in regions where the hydrophilic/hydrophobic character has been changed.

In the color filter master plate, methods for heating, supplying acid, or irradiating in order to cause a change in the functional group having the changeable hydrophilic/hydrophobic character are not particularly limited and known methods can be employed. Kinds of irradiation which may be employed include infrared rays and visible rays, plus ultraviolet rays, electron beams, X-rays and the like, and a light source to be employed is preferably selected from various kinds of laser lights. When heating is employed, energy may be supplied by directly heating the surface using a heating means such as a thermal head, and it is also possible to add a photo-thermal conversion agent to the recording layer and carry out heating of the surface by irradiation. When acid is used, it is common to generate acid in an exposed portion or heated portion via energy from irradiation or localized heating.

In the color filter master plate of the present invention, it is possible to form striped, mosaic, or other fine pattern corresponding to the precision of infrared laser irradiation or the means employed for heating in order to form colored pixels or a black matrix by selectively causing a dye or a pigment to be adsorbed by the heated portion or the infrared laser exposed portion, corresponding to a polarity of the surface of the polymer compound including the functional group having the hydrophilic/hydrophobic character that is changeable by heat, acid, or irradiation.

In the color filter master plate of the present invention, the layer to be colored, on which regions that locally adsorb a dye or a pigment are formed by polarity conversion thereon for forming the colored phase (colored pixels) or a black matrix, is called the recording layer.

The polymer compound, having the polarity conversion group, to be used in the recording layer, for example, is bonded with the substrate or a lower layer, which will be described later, directly or through a main chain polymer compound at the terminal of the polymer compound and a dye for forming the colored pixels or inorganic fine particles for forming the black matrix are firmly adsorbed by the recording layer surface in an ionic manner corresponding to the polarity thereof, so that both the image region and the non-image region have high strength and wear resistance. As a result, the dye or the pigment is adsorbed on the polarity conversion group in an ionic manner and firmly adsorbed in a nearly mono-molecular film state and therefore, even if the recording layer is thin, it is possible to form pixels or the black matrix with high density and excellent sharpness.

Since such a color filter master plate has a recording layer with a cross-linked structure, formation of the image region, that is, a region in which a dye or a pigment is to be adsorbed, and the non-image region is based on the polarity conversion of the surface and a plurality of patterns of coloring regions or nontransparent regions can be formed in a single plane.

DESCRIPTION OF THE PREFERRED EMBODIMENTS

An image forming material and a color filter master plate of the present invention will now be described in detail.

Description will be given with respect to a means for forming an image recording layer in which a functional group with a changeable hydrophilic/hydrophobic property is chemically bonded to a surface of a substrate either directly or via a main chain polymer at a terminal of the polymer chain, which is a feature of the image forming material of the present invention, and to means for forming a recording layer containing a polymer compound having a functional group with a changeable hydrophilic/hydrophobic character, which is a feature of the color filter master plate of the present invention.

Surface Graft Polymerization

The image recording layer and the recording layer of the present invention are generally formed by means of so-called surface graft polymerization. Graft polymerization is a method for synthesizing a graft polymer by supplying an active seed to a polymer compound chain and accordingly polymerizing another monomer capable of starting polymerization and particularly, when a polymer compound supplied with the active seed forms a solid surface, this is called surface graft polymerization.

Any known method described in the literature may be employed in the surface graft polymerization for achieving the present invention. For example, surface graft polymerization methods including an optical graft polymerization method and a plasma graft polymerization method disclosed in *New Polymer Experimental Study* 10, edited by The Society of Polymer Science, Japan, published by Kyoritsu Shuppan Co., Ltd., (1994) p. 135, and an irradiation graft polymerization method using irradiation such as γ-rays, electron beams and the like, disclosed in *Handbook of Adsorption Technology*, NTS Co., edited by Takeuchi, (1999) pp. 203, pp. 695, may be used.

Specific examples of the optical graft polymerization method are disclosed in Japanese Patent Application Laid-open (JP-A) Nos. 10-296895 and 11-119413 and may be used.

The means for forming a surface graft layer containing a polymer compound chain whose terminal is directly chemically bonded may include, besides the above-described methods, a coupling reaction carried out by supplying a reactive functional group, such as a trialkoxysilyl, isocyanate group, an amino group, a hydroxyl group, or a carboxyl group, to a terminal of the polymer compound chain and causing the reactive functional group to react with a functional group on a surface of a substrate or on a surface of a lower layer of the color filter master plate by coupling reaction.

Incidentally, the surface of the substrate and the lower layer of the color filter master plate of the present invention refer to surfaces having a function of chemically bonding with a terminal of a polymer compound having a polarity conversion group either directly or via a main chain polymer compound. The substrate of the image recording layer and substrate of the color filter master plate of the present invention themselves may be those having such surface properties, and when intermediate layer is formed on the substrate, the intermediate layer may have such properties.

Further, means for forming the surface to which the terminal of the polymer compound chain having the polarity conversion group is bonded via the main chain polymer compound may be carried out by supplying to a side chain of the main chain polymer compound, a functional group capable of coupling with the substrate surface functional group synthesizing a graft polymer compound containing a polymer compound chain having a functional group with a changeable hydrophilic/hydrophobic character as a graft chain, and reacting such a polymer with the lower surface functional group by a coupling reaction.

Functional Group Changeable Hydrophilic/Hydrophobic Character

Next, the functional group (the polarity conversion group) with a hydrophilic/hydrophobic character thereof being changeable by heat, acid or irradiation, which is a feature of the image forming material and the color filter master plate of the present invention, will be described.

There are two kinds of polarity conversion groups: functional groups that are changeable from a hydrophobic state to a hydrophilic state and functional groups that are changeable from a hydrophilic state to a hydrophobic state.

Functional Group Changeable from Hydrophobic State to Hydrophilic State

Functional groups that are changeable from a hydrophobic state to a hydrophilic state include known functional groups described in the related literature.

Useful examples of such functional groups include alkylsulfonic acid esters, disulfone, and sulfonimide described in JP-A No. 10-282672; alkoxyalkyl esters described in EP No. 0652483 and WO No. 92/9934; tert-butylester described in *Macromolecules,* vol. 21, by H. Ito et al., p. 1477; and carbonic acid esters protected with acid decomposable groups, such as silylester, vinyl ester and the like, described in the related literature.

Further examples include iminosulfonate groups described in *Surface,* vol. 133, by Masahiro Tsunooka, p. 374 (1995); β-ketonesulfonate described in *Polymer preprints,* Japan, vol. 46, by Masahiro Tsunooka, p. 2045 (1997); and nitrobenzylsulfonate compounds disclosed in JP-A No. 63-257750, by Tsuguo Yamaoka but are not limited to these functional groups.

Among these, especially excellent examples are secondary alkylsulfonate groups, tertiary carboxylate groups, and below-mentioned alkoxyalkylester groups.

The secondary alkylsulfonate groups which are excellent as the functional group that is changeable from a hydrophobic state to a hydrophilic state are those represented by the following general formula (1):

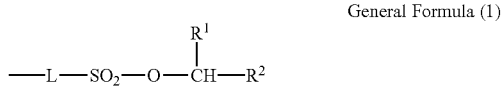

General Formula (1)

in which L represents an organic group including a multi-valent non-metal atom necessary for bonding to a polymer skeleton, $R^1$ and $R^2$ each independently represent a substituted or unsubstituted alkyl group, and $R^1$ and $R^2$ may form a ring with a secondary carbon atom (CH) bonded thereto.

The reference characters $R^1$ and $R^2$ of the general formula (1) separately represent a substituted or unsubstituted alkyl, a substituted or unsubstituted aryl group, and $R^1$ and $R^2$ may form a ring with the secondary carbon atom (CH) bonded thereto. When $R^1$ and $R^2$ represent a substituted or unsubstituted alkyl group, the alkyl group comprises a straight chain, branched or cyclic alkyl group such as a methyl group, an ethyl group, an isopropyl group, a tert-butyl group, a cyclohexyl group, or the like, and those with 1 to 25 carbon atoms are preferably used. When $R^1$ and $R^2$ represent a substituted or unsubstituted aryl group, the aryl group comprises a carbon cyclic aryl group or heterocyclic aryl group. Examples of the carbon cyclic aryl includes those having 6 to 19 carbon atoms, such as phenyl groups, naphtyl groups, antracenyl groups, and pyrenyl groups. Examples of the heterocyclic aryl group includes those having 3 to 20 carbon atoms and 1 to 5 heteroatoms, such as pyridyl groups, furyl groups; condensed benzene ring-containing groups such as quinolyl groups, benzofuryl groups, thioxanthone groups, carbazole groups, and the like.

When $R^1$ and $R^2$ represent a substituted alkyl group or a substituted aryl group, the substituent group may be an alkoxy group having 1 to 10 carbon atoms such as a methoxy group, an ethoxy group or the like; a halogen atoms, such as a fluorine atom, a chlorine atom, or a bromine atom; a halogen-substituted alkyl group, such as a trifluoromethyl group or a trichloromethyl group; an alkoxycarbonyl group or an aryl oxycarbonyl group 2 to 15 carbon atoms, such as a methoxycarbonyl group, an ethoxycarbonyl group, a tert-butyloxycarbonyl group or a p-chlorophenyloxycarbonyl group; a hydroxyl group; an acyloxy group, such as an acetyloxy group, a benzoyloxy group, a p-diphenylaminobenzoyloxy group; a carbonate group, such as a tert-butyloxycarbonyloxy group; an ether group, such as a tert-butyloxycarbonylmethyloxy group or a 2-pyranyloxy group; a substituted or unsubstituted amino group, such as an amino group, a dimethylamino group, a diphenylamino group, a morpholino group or an acetylamino group; a thioether group, such as a methylthio group or a phenylthio group; an alkenyl group, such as a vinyl group or a styryl group; a nitro group; a cyano group; an acyl group, such as a formyl group, an acetyl group, a benzoyl group or the like; an aryl group, such as a phenyl group or a naphthyl group; or a heteroaryl group, such as a pyridyl group; or the like. Also, when $R^1$ and $R^2$ represent a substituted aryl group, besides the above-listed groups, an alkyl group, such as a methyl group or an ethyl group, may be included as the substituent group.

$R^1$ and $R^2$ are preferably a substituted or unsubstituted alkyl group in terms of storage stability of the sensitive material and an alkyl group substituted with an electron attractive group such as an alkoxy group, a carbonyl group, an alkoxycarbonyl group, a cyano group, a halogen group or the like; or an alkyl group, such as a cyclohexyl group or a norbonyl group, is particularly preferable in terms of stability over time. With respect to physical properties, compounds having the chemical shift of hydrogen of secondary methine appearing in a magnetic field by proton NMR in dichloroform are preferably at 4.4 ppm or lower magnetic field, and more preferably at 4.6 ppm or lower magnetic field. Thus, the reason why the alkyl group substituted with an electron attractive group is preferable is because it is believed that carbocation thought to be produced as an intermediate during a thermal decomposition reaction is made unstable by the electron attractive group, resulting in suppression of decomposition. More particularly, the structure of —CHR$^1$R$^2$ is especially preferably a structure represented by following formulae.

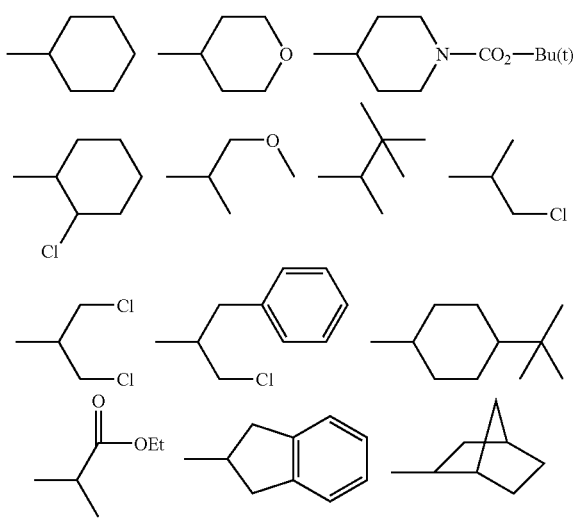

Further, the multivalent bonding group represented by L in the above-described general formula (I) and comprising of the non-metal atom is a group including 1 to 60 carbon atoms, 1 to 10 nitrogen atoms, 0 to 50 oxygen atoms, 1 to 100 hydrogen atoms, and 0 to 20 sulfur atoms. More specific examples of the bonding group included groups composed by combining the following structural units.

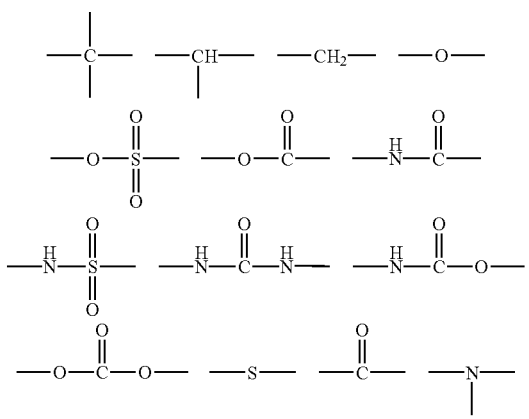

-continued

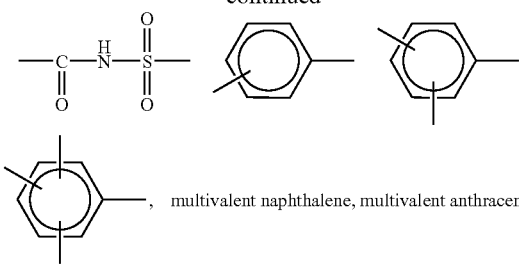

, multivalent naphthalene, multivalent anthracene.

When the multivalent bonding group has a substituent group, usable examples thereof include an alkyl group including 1 to 20 carbon atoms, such as a methyl group, an ethyl group or the like; an aryl group including 6 to 16 carbon atoms, such as a phenyl group, a naphthyl group or the like; a hydroxyl group; a carboxyl group; a sulfonamide group; an N-sulfonylamido group; an acyloxy group including 1 to 6 carbon atoms, such as an acetoxy group; an alkoxy group including 1 to 6 carbon atoms, such as a methoxy group, an ethoxy group, or the like; a halogen atom, such as chlorine, bromine, or the like; an alkoxycarbonyl group including, 2 to 7 carbon atoms, such as a methoxycarbonyl group, an ethoxycarbonyl group, a cyclohexyloxycarbonyl group, or the like; a cyano group; and a carbonate group, such as a tert-butylcarbonate and the like.

In the present invention, the alkoxyalkylester groups which are especially excellent as the functional group that is changeable from a hydrophobic state to a hydrophilic state includes those represented by the following general formula (2):

General Formula (2)

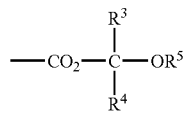

in which R$^3$ represents a hydrogen atom, R$^4$ represents a hydrogen atom or an alkyl group including 18 carbon atoms or less, and R$^5$ represents an alkyl group of 18 carbon atoms or less; and two of R$^3$, R$^4$ and R$^5$ may be bonded to each other to form a ring. Especially, R$^4$ and R$^5$ are preferably bonded to form a 5- or 6-member ring.

As described above, a secondary alkylsulfonate group represented by the general formula (1) is especially preferable as the functional group that is changeable from a hydrophobic state to a hydrophilic state in the present invention.

Specific examples. (functional groups (1) to (13)) of the functional group represented by the general formulae (1) and (2) are shown below.

(1)

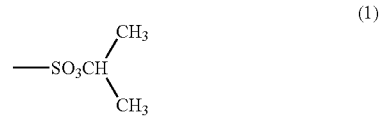

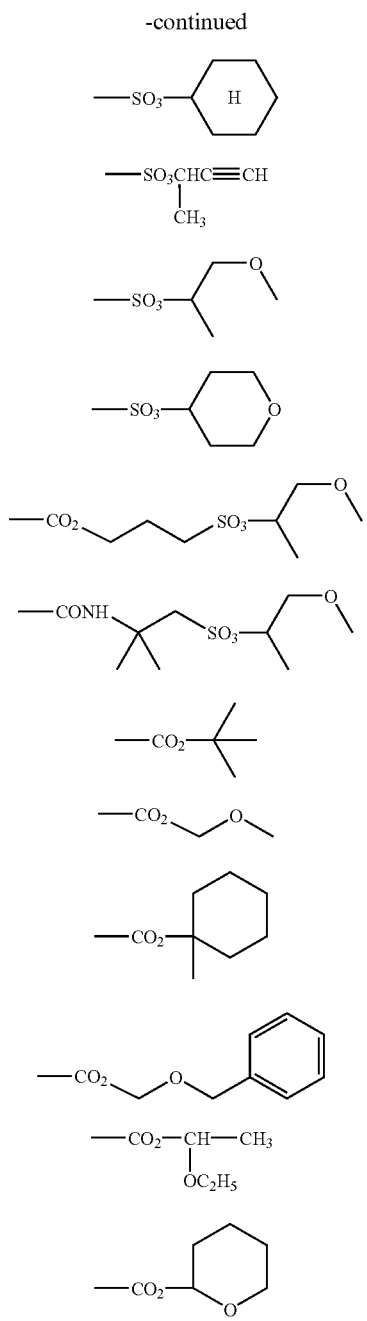

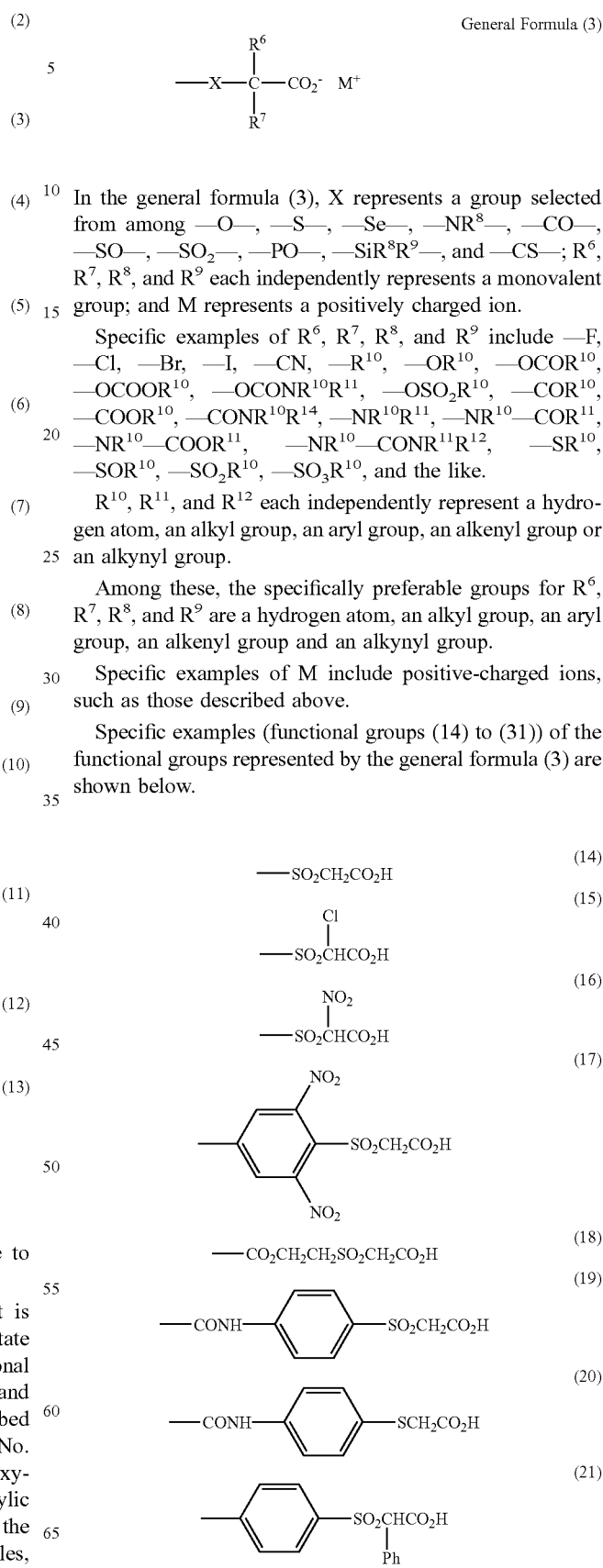

Functional Group Changeable from Hydrophilic State to Hydrophobic State

In the present invention, the functional group that is changeable from a hydrophilic state to a hydrophobic state by heat, acid, or irradiation includes known functional groups such as polymers containing an onium base, and especially those containing an ammonium salt, as described in, for example, JP-A No. 10-296895 and U.S. Pat. No. 6,190,830. Specific examples include (meth)acryloyloxy-alkyltrimethylammonium and the like. Further, a carboxylic acid group and a basic carboxylic acid represented by the following general formula (3) are also preferable examples, but the functional group is not limited to these examples.

In the general formula (3), X represents a group selected from among —O—, —S—, —Se—, —NR$^8$—, —CO—, —SO—, —SO$_2$—, —PO—, —SiR$^8$R$^9$—, and —CS—; R$^6$, R$^7$, R$^8$, and R$^9$ each independently represents a monovalent group; and M represents a positively charged ion.

Specific examples of R$^6$, R$^7$, R$^8$, and R$^9$ include —F, —Cl, —Br, —I, —CN, —R$^{10}$, —OR$^{10}$, —OCOR$^{10}$, —OCOOR$^{10}$, —OCONR$^{10}$R$^{11}$, —OSO$_2$R$^{10}$, —COR$^{10}$, —COOR$^{10}$, —CONR$^{10}$R$^{14}$, —NR$^{10}$R$^{11}$, —NR$^{10}$—COR$^{11}$, —NR$^{10}$—COOR$^{11}$, —NR$^{10}$—CONR$^{11}$R$^{12}$, —SR$^{10}$, —SOR$^{10}$, —SO$_2$R$^{10}$, —SO$_3$R$^{10}$, and the like.

R$^{10}$, R$^{11}$, and R$^{12}$ each independently represent a hydrogen atom, an alkyl group, an aryl group, an alkenyl group or an alkynyl group.

Among these, the specifically preferable groups for R$^6$, R$^7$, R$^8$, and R$^9$ are a hydrogen atom, an alkyl group, an aryl group, an alkenyl group and an alkynyl group.

Specific examples of M include positive-charged ions, such as those described above.

Specific examples (functional groups (14) to (31)) of the functional groups represented by the general formula (3) are shown below.

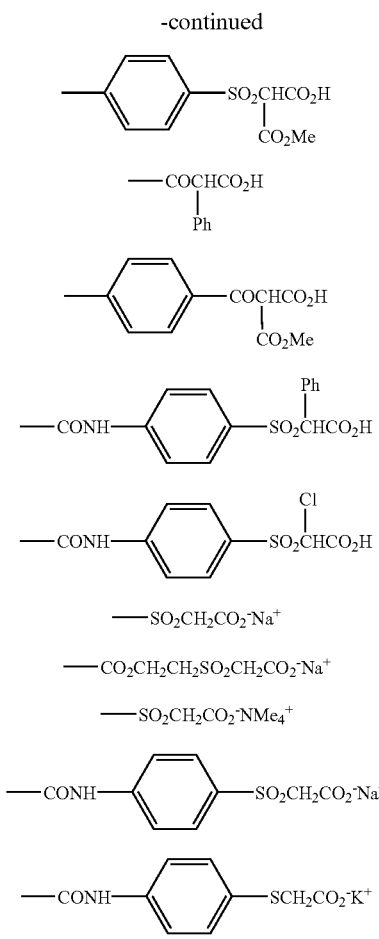

If the present invention, the polymer compound including the polarity conversion group may be a homopolymer of a single monomer or a copolymer of two or more monomers including the above-described functional group. Further, the polymer compound may be a copolymer containing another monomer as long as the effects of the present invention are not thereby deteriorated.

Specific examples of the monomers including the above-described functional groups are shown below. Specific examples of those including the functional groups represented by the above-described general formulas (1) and (2) are shown as exemplary monomers (M-1) to (M-15).

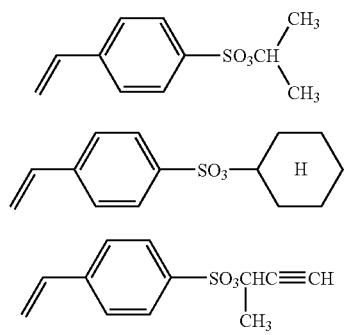

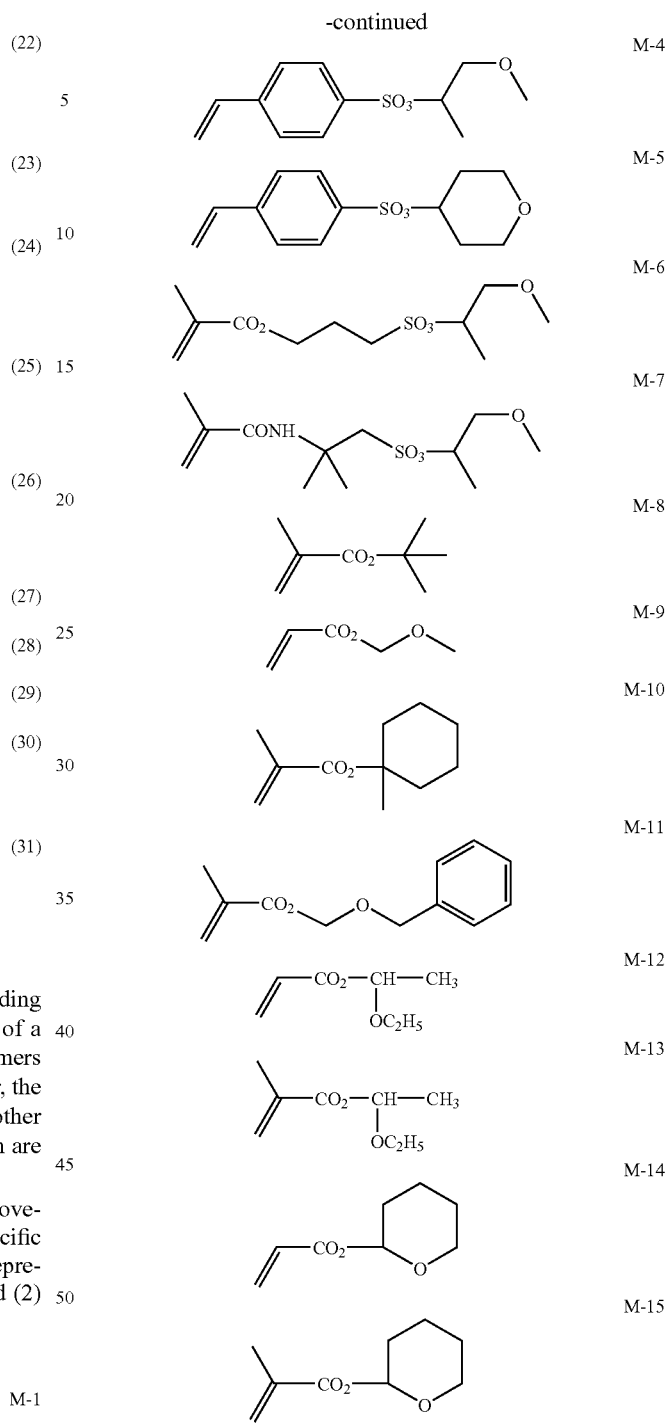

Specific examples of the monomers containing the functional groups represented by the general formula (3) are shown as exemplary monomers (M-16) to (M-33).

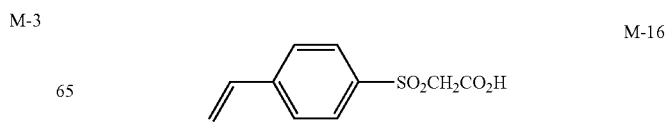

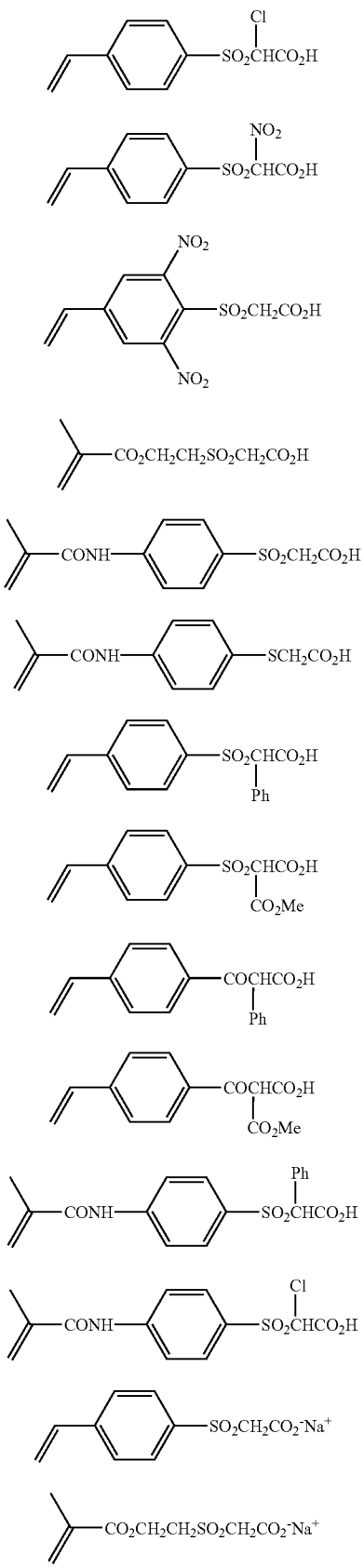
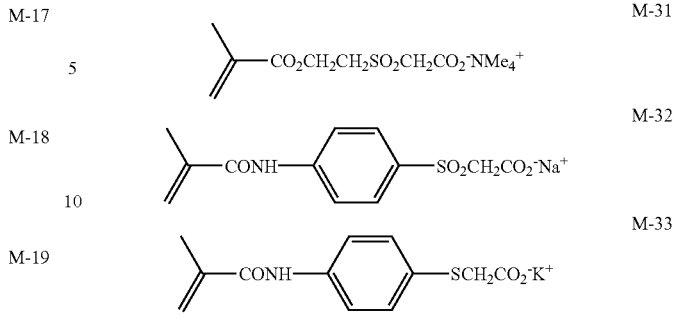

Substrate Surface of Image Forming Material

The image forming material of the present invention comprises the surface graft layer, what is formed by chemically bonding the terminal of the polymer compound having the polarity conversion group, directly or via a main chain polymer compound, and the substrate surface which is capable of being chemically bonded with the terminal of the polymer compound directly or via the main chain polymer compound. As described above, the substrate surface itself has this characteristic and an intermediate layer having such a characteristic may be provided at the substrate surface.

Substrate Surface or Intermediate Layer of Image Forming Material

The substrate surface may comprise either an inorganic layer or an organic layer as long as the layer has suitable characteristics for forming the surface graft layer by graft synthesis. In the present invention, the polarity of the surface for manifesting the change in hydrophilic/hydrophobic character in the image forming layer comprising a thin layer of the polymer compound does not matter and it may be hydrophilic or hydrophobic.

Especially, when the thin film polymer of the present invention is synthesized by an optical graft polymerization method, a plasma graft polymerization method, or an irradiation graft polymerization method, the intermediate layer preferably has an organic surface, and more preferably comprises a layer of an organic polymer. As the organic polymer, synthetic resins, such as epoxy resin, acrylic resin, urethane resin, phenol resin, styrene-based resin, vinyl-based resin, polyester resin, polyamide-based resin, melamine-based resin, formalin resin, or the like; and natural resin, such as gelatin, casein, cellulose, starch or the like, can be used. Since the graft polymerization is started by depleting hydrogen of an organic polymer in the optical graft polymerization method, the plasma graft polymerization method, and the irradiation graft polymerization method, it is preferable to use a polymer from which hydrogen is easily depleted, and use of acrylic resin, urethane resin, styrene-based resin, vinyl-based resin, polyester resin, polyamide-based resin, epoxy resin or the like is particularly preferable, especially from the viewpoint of production suitability.

The intermediate layer may be the substrate as described below or, if necessary, an intermediate layer formed on the substrate.

In the image forming material of the present invention, from a viewpoint of formability of the image forming layer and adhesion with respect to the image recording layer, a surface-roughened substrate may be used as the substrate to which the polymer compound is directly chemically bonded.

When such a surface-roughened substrate is used, the surface properties thereof preferably satisfy the following conditions.

Preferably a center line average roughness (Ra) of a two-dimensional roughness parameter is 0.1 to 1 μm, a maximum height (Ry) is 1 to 10 μm, a ten-point average roughness (Rz) is 1 to 10 μm, an average interval (Sm) between peaks and valleys is 5 to 80 μm, an average interval of the peaks (S) is 5 to 80 μm, a maximum peak height (Rt) is 1 to 10 μm, a center line peak height (Rp) is 1 to 10 μm, and a center line valley depth (Rv) is 1 to 10 μm. Those satisfying one of the above-described conditions are preferable and those satisfying all of the consitions are more preferable.

Description of Constitution of Color Filter Master Plate

The color filter master plate of the present invention comprises the recording layer(hereinafter, referred to as the thin film polymer layer), bonded directly or via a main chain polymer compound by chemical bonding at the terminal of the polymer compound containing the polarity conversion group, and a lower layer or a substrate surface to which the terminal of the polymer compound can be chemically bonded directly or via the main chain polymer compound.

Lower Layer of Color Filter Master Plate

The lower layer may be an inorganic or organic layer as long as it has suitable properties to form the thin film polymer layer by graft synthesization. Also, in the present invention, since the hydrophilic/hydrophobic character is changed in the image forming layer comprising the polymer compound in the thin film, it does not matter which polarity the surface has, and it may be hydrophilic or hydrophobic.

Especially when the thin film polymer of the present invention is synthesized by an optical graft polymerization method, a plasma graft polymerization method, or an irradiation graft polymerization method, the layer preferably has an organic surface, and more preferably comprises a layer of an organic polymer. As the organic polymer, synthetic resins, such as epoxy resin, acrylic resin, urethane resin, phenol resin, styrene-based resin, vinyl-based resin, polyester resin, polyamide-based resin, melamine-based resin, formalin resin, or the like; and natural resin such as gelatin, casein, cellulose, starch and the like can be used. Since the graft polymerization is started by depleting hydrogen of an organic polymer in the optical graft polymerization method, the plasma graft polymerization method, and the irradiation graft polymerization method, it is preferable to use a polymer from which hydrogen is easily depleted, and use of acrylic resin, urethane resin, styrene-based resin, vinyl-based resin, polyester resin, polyamide-based resin, epoxy resin or the like is particularly preferable especially from the viewpoint of production suitability.

The lower layer may be the substrate as it will be described below or, if necessary, a lower layer (an intermediate layer) formed on the substrate.

Photo-thermal Conversion Substance

When the image forming material of the present invention is used for image recording by an infrared laser or the like, a photo-thermal conversion substance for converting light energy to thermal energy is preferably added to a portion of the image forming material. The portion to which the photo-thermal conversion substance is added may be any of the image recording layer, the intermediate layer, and the substrate. Further a photo-thermal conversion layer may be formed between the intermediate layer and the substrate, and the substance may be added thereto.

Any substance may be used for the photo-thermal conversion substance to be employed in the image forming material of the present invention as long as it can absorb light rays such as ultraviolet rays, visible rays, infrared rays, white light, or the like, and convert the light rays to heat. Example of these substances include carbon black, carbon graphite, a pigment, a phthalocyanine-based pigment, an iron powder, a graphite powder, an iron oxide powder, lead oxide, silver oxide, chromium oxide, iron sulfide, chromium sulfide and the like and, especially preferable examples for use in the present invention are dyes, pigments, or fine metal powders having a maximum absorption wavelength in a range from 760 nm to 1,200 nm, which is the wavelength of the infrared laser exposure to be used for writing.

When pattern formation of the color filter master plate of the present invention is carried out by infrared laser, the photo-thermal conversion substance to convert the light energy to the thermal energy is preferably added to any portion of the color filter master plate in such a range that the substance does not affect the performance of the color filter. The portion to which the photo-thermal conversion substance is added may be, for example, any of the thin film polymer layer (the recording layer), the lower layer, and the substrate. Further a photo-thermal conversion layer may be formed between the lower layer and the substrate, and the substance may be added thereto.

In the color filter master plate of the present invention, any substance may be used for the photo-thermal conversion substance to be employed as long as it can absorb light rays, such as ultraviolet rays, visible rays, infrared rays, and incandescent rays or the like, and convert the light rays to heat. Examples of these substances include dyes, pigments, and fine metal powders having a maximum absorption wavelength in a range from 760 nm to 1,200 nm, and those having no absorption in the visible light range are preferable in terms of the characteristics of the color filter.

As the dyes for the photo-thermal conversion substance of the present invention, commercially available dyes and known compounds described in the literature (e.g., *Dye Handbook,* edited by The Society of Synthetic Organic Chemistry, Japan, published in 1970) can be employed. More specific examples include an azo dye, a metal complex salt azo dye, a pyrazolone azo dye, an anthraquinone dye, a phthalocyanine dye, a carbonium dye, a quinonimine dye, a methine dye, a cyanine dye, a metal thiolate complex dye and the like. Preferable dyes include cyanine dyes described in JP-A Nos. 58-125246, 59-84356, 59-202829, 60-78787; methine dyes described in JP-A Nos. 58-173696, 58-181690, 58-194595; naphthoquinone dyes described in JP-A Nos. 58-112793, 58-224793, 59-48187, 59-73996, 60-52940, 60-63744; squarylium dye described in JP-A No. 58-112792; and cyanine dyes described in British Patent No. 434,875.

In addition, near infrared absorption sensitizers described in U.S. Pat. No. 5,156,938; substituted arylbenzo(thio)pyrilium salts described in U.S. Pat. No. 3,881,924; trimethinethiapyrylium salts described in JP-A No. 57-142645 (U.S. Pat. No. 4,327,169); pyrylium-based compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Examined Japanese Patent Application Publication (JP-B) Nos. 5-13514 and 5-19702 are preferably employed. Further examples of other preferable dyes include near infrared absorption dyes defined by formulae (I) and (II) in the specification of U.S. Pat. No. 4,756,993. Among these dyes, especially preferable ones include cyanine dyes, squarylium dyes, pyrylium salts, and nickel thiolate complexes.

Examples of pigments to be employed in the present invention include commercially available pigments and pigments described in *Color Index (C.I.) Handbook, Current Pigment Handbook* (edited by the Japan Pigment Technology Association, 1977), *Newest Pigment Application Technology* (published by CMC Publisher, 1986), *Printing Ink Technology* (published by CMC Publisher, 1984) can be used. The types of pigments to be employed include black pigments, yellow pigments, orange pigments, brown pigments, red pigments, violet pigments, blue pigments, green pigments, fluorescent pigments, metal powder pigments, also polymer-binding pigments. Specifically, insoluble azo pigments, azo lake pigments, condensed azo pigments, chelate azo pigments, phthalocyanine-based pigments, anthraquinone-based pigments, perylene- and perinone-based pigments, thioindigo-based pigments, quinacridone-based pigments, dioxazine-based pigments, isoindolinone-based pigments, quinophthalone-based pigments, dyeing lake pigments, azine pigments, nitroso pigments, nitro pigments, natural pigments, fluorescent pigments, inorganic pigments, carbon black, and the like can be used. Among these, carbon black is preferable.

These dyes or pigments may be added in an amount of 0.01 to 50% by weight, and preferably 0.1 to 10% by weight, based on a total amount of solid matter in the layer containing the photo-thermal conversion substance. In the case of the dyes, the amount is more preferably from 0.5 to 10% by weight, and in the case of the pigments, the amount is more preferably from 3.1 to 10% by weight. If the amount of the pigments or the dyes added is less than 0.01% by weight, sensitivity is deteriorated and if it exceeds 50% by weight, film strength of the photo-thermal conversion substance-containing layer is weakened. Also, in the case of the color filter, amounts outside of the preferred range are likely to cause adverse effects on the functions of the filter.

Substrate of Image Forming Material

The substrate to be employed in the image forming material of the present invention, which substrate includes the surface the above-described characteristics, is preferably a plate-like material that is stable in size. The materials for the substrate include, for example, paper, paper laminated with plastics (e.g., polyethylene, polypropylene, polystyrene, and the like), metal sheets (e.g., aluminum, zinc, copper and the like), plastic films (e.g. cellulose diacetate, cellulose triacetate, cellulose propionate, cellulose butyrate, cellulose acetate butyrate, cellulose nitrate, polyethylene terephthalate, polyethylene polystyrene, polypropylene, polycarbonate, polyvinyl acetal, and the like), paper or plastic films laminated or coated by evaporation with the above-listed metals, and the like. The substrate to be used for the present invention is preferably a polyester film or an aluminum sheet, and of the two, a polyester film which can also function as the lower layer is especially preferable.

When the aluminum sheet is used for the substrate, it may be subjected to a known surface treatment, such as the above-described surface-roughening treatment, an anodization treatment or the like if necessary.

Further, also when a plastic film, such as the preferable polyester film, is used, it may be also be subjected to the above-described surface-roughening treatment in order to aid the formation of the hydrophilic surface and improve adhesion.

When the substrate used in the image forming material of the present invention also functions as the intermediate layer, films comprising the above-mentioned resin materials themselves may be used for the intermediate layer, and in such cases, the substrate surface, which is directly chemically bonded with the polymer compound forming the image recording layer, is preferably roughened.

Image Forming Method

An image forming method of the present invention using the image forming material produced in the above-described manner will be now described.

In an image forming mechanism of the image forming material of the present invention, the polarity conversion group of the polymer compound contained in the image recording layer causes polarity conversion in a heated or irradiated area which becomes positively or negatively charged, and by adsorbing organic or inorganic molecules to the area, the area becomes an image forming area. In an un-heated or un-irradiated area, the surface of the hydrophilic layer remains in its prior state, and no organic or inorganic molecules are adsorbed, leaving the area as a non-image area.

Next, a hydrophilic substance, such as a water-soluble dye, is adsorbed in the hydrophilic area obtained by polarity conversion, and a hydrophobic substance, such as an oleophilic dye, is adsorbed in the hydrophobic area to form an image.

Inscription of Image Forming Material

Inscription of an image in the image forming material of the present invention may be carried out by irradiation or heating. In the case of a material also using the photo-thermal conversion substance, an image can be formed with heat by scanning exposure using a laser beam in the infrared region.

As a method to be employed in image formation, inscription methods using heat and exposure to irradiation can be used. For example, light irradiation by an infrared laser, an UV lamp, visible light rays or the like; irradiation by an electron beam, such as X-ray; and thermal recording by a thermal head may be used. Light sources for the irradiation include, for example, a mercury lamp, a metal halide lamp, a xenon lamp, a chemical lamp, a carbon arc lamp, and the like. Examples of beams used for the irradiation include electron beams, γ-rays, ion beams, far infrared rays and the like. Further, g beams, i beams, deep-ultraviolet rays, and high density energy beams (laser beams) may also be used.

Preferable examples of specific methods to be employed include, direct imagewise recording by a thermal recording head, scanning exposure by an infrared laser, high luminance flash exposure by a xenon discharge lamp, exposure by an infrared lamp and the like.

In order to carry out direct image formation from digital computer data, a method using polarity conversion by laser exposure is preferable. Examples of the laser to be employed includes gas lasers, such as carbonic gas lasers, nitrogen lasers, Ar lasers, He/Ne lasers, He/Cd lasers, Kr lasers and the like; liquid (dye) lasers; solid lasers, such as ruby lasers, Nd/YAG lasers and the like; semiconductor lasers, such as GaAs/GaAlAs lasers, InGaAs lasers and the like; and excimer lasers, such as KrF lasers, XeCl lasers, XeF lasers, $Ar_2$ lasers and the like. Among these, solid and high output infrared lasers, such as semiconductor lasers, YAG lasers and the like, irradiating infrared rays of wavelengths within a range of 700 to 1,200 nm, are preferably employed for exposure.

Organic or Inorganic Molecules for Forming Image

The organic or inorganic molecule to be adsorbed on the polarity-converted surface may be a low molecular compound or a polymer compound as long as they can form a visible image.

That the visible image can be formed means that the adsorbed substance absorbs light of wavelengths in the visible light range and specific examples thereof include color dyes or pigments, a variety of nontransparent pigments, and fine metal particles.

Relationship of Polarity of Surface Graft Polymerization with Organic or Inorganic Molecules in Image Forming Material In the image recording layer having an anionic graft polarity conversion type functional group such as an alkylsulfonic acid ester group represented by the general formula (1) and specifically described above, only the exposed area is selectively negatively charged and a positively charged molecule, such as a cationic dye, is adsorbed thereon to form a visible image. When employing such an image forming mechanism, only the exposed portion undergoes polarity conversion and is provided with molecule-adsorbing capability, so that not only a monochromatic image but also a multi-color image can be formed.

In other words, the image forming material is exposed, a cationic dye of a yellow hue is adsorbed on the exposed area, and the excess dye is removed by washing with water to form a yellow image. At this point, since the un-exposed portion is not affected by the polarity conversion group, a magenta image can be formed by imagewise exposing the same image forming material again to cause polarity conversion and by adsorbing a cationic dye of a magenta hue to the newly exposed area. Further, by forming a cyan image in a similar manner, it is possible to form a multi-color image by step by step imagewise exposure.

Examples of the cationic organic or inorganic molecules to be employed in such image formation include a cationic dye, a cationically charged inorganic pigment, a fine metal particle, and a coated pigment and coated fine metal particle having a cationic surface layer.

The cationic dye to be employed may be appropriately selected from known dyes according to specific objectives, such as hue, image density, and the like. Such a cationic dye is electrically attracted to the surface of the image recording layer due to the function of the acidic group (e.g., sulfonic acid group, a caboxylic acid group, or the like), which is the above-described polarity conversion group, penetrates not only the surface but also the inside of the image recording layer, and is finally bonded with the acidic group to form an image. The image is formed based on ionic interaction, so that the dye is firmly adsorbed and provides the image with high durability and high density even in a small amount.

Examples on the cationic dye include dyes having a chromophoric group terminated with alkylamino or aralkylamino groups, dyes having acidamido bonds such as sulfonic acid alkylamido bonds, azo dyes having groups capable of forming cations, heterocyclic compounds such as methine dyes, thiazol and azo dyes and the like. Examples of skeletal structures of the cationic dyes include triphenylmethane, diphenylmethane, xanthene, acridine, azine, thiazine, thiazol, oxazine, and azo, and such dyes are described in detail in *New Dye Chemistry*, written by Yutaka Hosoda, pp. 316–322 (Gihodo, 1957).

As another image forming mechanism, for example, the image forming layer contains a cation graft polarity conversion functional group, such as an ammonium disclosed in JP-A No. 10-296895, and when the recording layer material surface, which originally has a positive charge, is exposed, only the exposed portion loses the electric charge. Then when negatively charged molecules, such as an acidic dye are adsorbed thereon, the molecules are adsorbed in the non-exposed portion to form a visible image. When such an image forming mechanism is employed, the organic or inorganic molecules are adsorbed only in the non-exposed portion, and thus an image forming material suitable for monochromatic image formation can be obtained.

Examples of the anionic organic or inorganic molecules to be employed for such image formation include an acidic dye, an inorganic pigment electrostatically charged to be anionic, a fine metal particle, and a coated pigment or a coated fine metal particle having an anionic surface layer.

The acidic dye to be employed in this case can be appropriately selected from known according to specific objectives, such as hue, image density, and the like. Examples of such acidic dyes include azo-based dyes, anthraquinone-based dyes, triphenylmethane-based dyes, xanthene-based dyes, azines, and quinoline dyes, and any of these dyes can optionally be used. Specific examples thereof include, C.I. Acid Yellow 1, C.I. Acid Orange 33, C.I. Acid Red 80, C.I. Acid Violet 7, C.I. Acid Blue 93 and the like, and these dyes are described in detail in *Dye Handbook*, edited by The Society of Synthetic Organic Chemistry, Japan, pp. 392–471 (Maruzen Co., Ltd., 1970).

When using a charged fine particle, the center portion, or so-called core, of the fine particle may be inorganic or organic. When the core is an inorganic substance, it is preferably a noble metal particle, such as gold, silver, palladium, rhodium, or platinum, and when the core is an organic substance, organic polymers are preferable.

A particle size of the charged fine particle is preferably in a range from 0.1 nm to 1,000 nm, and more preferably in a range from 1 nm to 100 nm. If the particle size is smaller than 0.1 nm, it is inferior in handling properties. If it is larger than 1,000 nm, a contact surface area for ionic bonding with the polarity-converted functional group becomes small, and strength of the formed image tends to be thereby decreased.

Especially when a transparent substrate comprising materials such as glass, a transparent plastic film or the like is used, those with a particle size in a range of 0.2 to 100 nm are preferable, and those with a particle size in a range of 1 to 10 nm are more preferable, from the standpoint of attaining light transmissivity and visibility.

The charged fine particle with a high density in the surface can be produced, for example, by methods proposed by Toru Yonezawa, et al., in T. Yonezawa, *Chemistry Letters*, 1999 pp. 1061, T. Yonezawa, *Langumuir*, 2000, vol. 16, pp. 5218, and T. Yonezawa, *Polymer Preprints*, Japan vol. 49, pp. 2911 (2000). Yonezawa, et al., show that it is possible to chemically modify a metal particle surface with a charged functional group to a high density using a metal-sulfur bonding.

The organic or inorganic molecules may be used not only singly, but also as a mixture of a plurality of different types of the molecules if necessary. Further, in order to obtain desired hue, a plurality of materials to be employed may be premixed therewith.

One method for adsorbing the organic or inorganic molecules on the polarity-converted area is applying a coating solution, in which the organic or inorganic charged molecules on the surface are dissolved or dispersed, to the substrate surface, which has been subjected to polarity conversion by imagewise exposure. In another method the substrate surface, which has been subjected to polarity conversion by imagewise exposure, is dipped in such a solution or dispersion. When either method is used, in order to supply an excess amount of the organic or inorganic molecules and to sufficiently introduce the molecules by ionic bonding to the polarity conversion group, a contact duration of the solution or dispersion with the substrate surface is preferably from about 10 seconds to 60 minutes, and more preferably from about 1 minute to 20 minutes.

The organic or inorganic molecules are preferably bonded with a maximum amount possible being adsorbed on the polarity-converted portion of the substrate surface from the standpoint of sharpness, hue, and durability of the image. Also, in terms of adsorption efficiency, a concentration of the solution or dispersion is preferably at least from 10 to 20% by weight.

An amount of the organic or inorganic molecules to be used may appropriately be selected depending on the image forming mechanism of the image forming material. Since the organic or inorganic molecules are introduced by ionic adsorption in an approximately monomolecular film state, as compared with an amount of a coloring material or colored material used with a general image forming material, a small amount of the organic or inorganic molecules can form an image with high density and high sharpness.

Further, by adsorbing a nontransparent material, such as an inorganic pigment or a metal pigment, or a light transmissive colored dye to a resin film having the surface properties described above for the substrate, light transmissive pattern forming materials and display materials, such as OHP materials and decorative electric illumination, can easily be obtained.

It is expected that the image forming material of the present invention subjected to image formation by the above-described methods will be used as a variety of pattern forming materials and display materials in a wide range of fields.

Substrate of Color Filter Master Plate

The lower layer substrate of the color filter master plate of the present invention may include a glass substrate or a substrate for a solid imaging device for forming a color filter thereon. In the case of a plastic liquid crystal display device, further examples include a crystalline polymer, such as a monoaxially or a biaxialy extruded polyethylene terephthalate; a noncrystalline polymer, such as polysulfone, polyether sulfone, or the like; a polyolefin such as polyethylene or polypropylene; a polycarbonate; and a polyamide such as nylon or the like. By using such a flexible substrate, a display face of the liquid crystal display device can be curved, and thus a liquid crystal display device with a display face having a large surface area and curved-display capability can be obtained.

Examples of a method for producing the color filter of the present invention, using the color filter master plate obtained in the above-described manner, include forming a stained area by adhering a dye to a latent image comprising patterns formed by subjecting the color filter master plate to hydrophilic/hydrophobic character conversion (polarity conversion) by heat, acid, or irradiation or forming a nontransparent area by adhering a nontransparent fine particle, such as a metal pigment.

One method for using the area where the hydrophilic/hydrophobic character is changed, uses a material having a hydrophobic functional group as the polarity conversion group and includes steps of converting a predetermined area from a hydrophobic state to a hydrophilic state by applying energy thereto and staining the area converted to be hydrophilic state. Another method uses a material having a hydrophilic functional group as the polarity conversion group and includes steps of changing a predetermined area from a hydrophilic state to a hydrophobic state by applying energy thereto and staining an area which remains hydrophilic state (e.g., an un-exposed area). Both methods are possible, but when producing a color filter having a plurality of hue, as in the present invention, the former method is preferable.

Alternatively, it is possible to stain a hydrophobic area after converting polarity, using, for example, an oleophilic dye. In this case, for reasons described above, an advantageous method uses a material having a hydrophilic functional group as the polarity conversion group and includes steps of converting a predetermined area from hydrophilic state to a hydrophobic state by applying energy thereto and staining the hydrophobic area formed by the conversion.

Formation of Color Filter

In order to produce a color filter using the color filter master plate of the present invention, inscription to define pixels or a black matrix in the color filter master plate is carried out by heating or exposure. In this case, if the color filter master plate is of a type containing a combination of the photo-thermal conversion material, an area for adsorbing a dye or a pigment can be defined by scanning exposure with a laser beam in the infrared region.

Methods for defining the area include carrying out inscription with heat, light and the like. Specifically, direct recording by a thermal recording head using a simple and compact heat sensitive printer such as a word processor or the like, or using kinds of thermal heads, such as a heat sensitive facsimile or the like; scanning exposure by infrared laser; high luminance flash exposure by a xenon discharge lamp; and infrared lamp exposure can be employed.

From the standpoint of productivity improvement, in order to define the pixels and the area of the black matrix directly by digital computer data, a method for causing polarity conversion by laser exposure is preferable. Examples of the laser to be used include, gas lasers, such as a carbonic gas laser, a nitrogen laser, an Ar laser, a He/Ne laser, a He/Cd laser, a Kr laser or the like; liquid (dye) lasers; solid lasers, such as a ruby laser, a Nd/YAG laser, or the like; semiconductor lasers, such as a GaAs/GaAlAs laser, an InGaAs laser or the like; and excimer lasers, such as a KrF laser, a XeCl laser, a XeF laser, an $Ar_2$ laser or the like. Among these, a solid high output infrared laser, such as a semiconductor laser, a YAG laser or the like, irradiating infrared rays with a wavelength within a range of 700 to 1,200 nm is preferably employed for exposure.

As the dyes to be employed for forming the pixels of each hue, any can optionally be selected from among known dyes as long as they have desired characteristics necessary for the color filter with respect to hue, light transmissive property, and durability. Specific examples of the dyes include an acidic dye, a basic dye, and a reactive dye such as an azo dye, an anthraquinone dye, an indigo dye, a sulfide dye, a carbonium dye, a quinonimine dye, a phthalocyanine dye, a cyanine dye, a quinoline dye, a nitro dye, a nitroso dye and the like. Examples of azo dye include an acidic dye, a basic dye, an acidic mordant dye, an acetate dye, an azoic dye, a pyrazolone dye, a stilbene dye, and a thiazol dye; examples of the anthraquinone dyes include a mordant dye, an acidic mordant dye, an acidic dye, and an acetate dye; examples of the indigo dyes include indigo and thioindigoid; examples of the carbonium dyes include a diphenylmethane dye, a triphenylmethane dye, a xanthene dye, and acridine dye; and examples of quinonimine dyes include an azine dye, an oxazine dye, and a thiazine dye.

Adsorbing a dye or a pigment using other positive and negative electric charges aside the hydrophilic/hydrophobic character is also effective from the standpoint of staining properties and adsorbing properties. In the image forming mechanism of the color filter of the present invention, the polarity conversion group of the polymer compound contained in the recording layer causes polarity conversion in the heated or irradiated area and generates positive or negative charges. A dye or a charged pigment is adsorbed in the area to form colored pixels or a black matrix. In the non-heated or non-irradiated area of the surface, however, the polarity conversion group remains in its original condition, and the area becomes an area where neither a dye nor a pigment is adsorbed.

When the functional group with a polarity convertable by energy is acidic, it is preferable to adsorb a basic dye or a negatively charged pigment. Conversely in the case the functional group with a polarity converted by energy supply is basic, it is preferable to use an acidic dye or a pigment charging positively.

Skeletal structures of the basic dyes include triphenylmethane, diphenylmethane, xanthene, acridine, azine, thiazine, thiazol, oxazine, and azo, and skeletal structures of the acidic dyes include azo, anthraquinone, triphenylmethane, xanthene, azine dye, and quinoline.

Specific examples of the basic dyes include:
C.I. Basic Blue 3, 9, 22, 41, 45, 47, 54, 64, 66, 67, 129;
C.I. Basic Yellow 11, 13, 15, 21, 23, 24, 25, 28, 32, 36, 41, 73, 80;
C.I. Basic Red 1, 2, 12, 13, 14, 17, 22, 23, 27, 29, 30, 38, 39, 46, 46: 1, 82;
C.I. Basic Orange 2, 14, 21, 24, 25;
C.I. Basic Violet 1, 3, 10, 11, 14, 16, 18, 39;
C.I. Basic Green 4;

and the like, but are not limited to these.

Specific examples of the acidic dyes include:
C.I. Acidic Blue 7, 14, 22, 25, 40, 45, 59, 78, 80, 92, 102, 112, 113, 117, 126, 127:1, 129, 145, 167, 230;
C.I. Acid Yellow 17, 18, 23, 25, 36, 38, 42, 44, 54, 59, 72, 78, 151;
C.I. Acid Green 25, 27;
C.I. Acid Orange 7, 10, 12, 19, 20, 22, 28, 30, 52, 56, 74, 127;
C.I. Acid Red 1, 3, 4, 6, 8, 11, 12, 14, 18, 26, 33, 37, 50, 52, 57, 82, 88, 106, 108, 11, 114, 131, 137, 138, 151, 154, 158, 159, 173, 184, 186, 215, 257, 266, 296, 337;
C.I. Acid Violet 11, 41, 42, 43, 49, 56, 58;

and the like, but are not limited to these.

In a recording layer containing an anionic graft polarity conversion type functional group, such as an alkylsulfonic acid ester represented by the general formula (1) specifically described before, only the exposed area is selectively negatively charged, and positively charged molecules, such as a cationic dye, is adsorbed thereon to form colored pixels. When employing such an image forming mechanism, only the exposed portion undergoes polarity conversion and is provided with adsorption capability, so as to be suitable for forming multi-color pixels such as those of a color filter. It is possible to color a pixel area using a cationic dye or to form a black matrix with a cationically charged inorganic pigment or a fine metal particle, and a coated pigment or coated fine metal particle having a cationic surface layer.

Such a colored or nontransparent area is formed based on ionic interaction, so that the dye or the pigment is firmly adsorbed, providing pixels or a black matrix with a high durability and high density even in a small amount.

When using a charged pigment comprising fine particles, a center portion, or so-called core, of the pigment fine particles may be either inorganic or organic, and when the core comprises an inorganic substance, it is preferably a noble metal particle such as gold, silver, palladium, rhodium, or platinum. When the core comprises an organic substance, on the other hand, organic polymers are preferable.

A particle size of the charged fine particles is preferably within a range of from 0.1 nm to 1,000 nm, and further preferably within a range of from 1 nm to 100 nm. If the particle size is smaller than 0.1 nm, the particle is inferior in handling properties. If the particle size is larger than 1,000 nm, a contact surface area for ionic bonding with the polarity-converted functional group becomes small and strength of the formed image tends to be thereby decreased.

The charged fine particle with a high density in the surface can be produced, for example, by methods proposed by Toru Yonezawa, et al., that is, T. Yonezawa, *Chemistry Letters,* 1999 p. 1061, T. Yonezawa, *Langumuir,* 2000, vol. 16, pp. 5218, and T. Yonezawa, *Polymer Preprints,* Japan vol. 49, pp. 2911 (2000). Yonezawa, et al., show that it is possible to chemically modify a metal particle surface with a charged functional group to a high density, using a metal-sulfur bonding.

One method for adsorbing the dye or the pigment in the polarity-converted area is by applying a coating solution, in which the dye or the pigment is dissolved or dispersed, to the substrate surface which has been subjected to the polarity conversion by exposure and on which the adsorption group has been formed. In another method the substrate surface, which has been subjected to polarity conversion by imagewise exposure, is dipped in such a solution or dispersion. When either method is used, in order to supply an excess amount of the dye or the pigment and to sufficiently introduce it into the polarity conversion group by ionic bonding, a contact duration of the solution or dispersion with the substrate surface is preferably from about 10 seconds to 60 minutes, and more preferably from about 1 minute to 20 minutes.

The dye or pigment is preferably bonded with a maximum amount possible being adsorbed on the polarity-converted area of the substrate surface from the standpoint of sharpness, hue, and durability of the image. Also, in terms of adsorption efficiency, a concentration of the solution or dispersion is preferably at least from 10 to 20% by weight.

In the color filter formed using a color filter master plate of the present invention, it is possible, by the above-described methods, to easily form in a variety of patterns pixels or a black matrix, and to form pixels with various hues in an even plane or, if desired, a black matrix having characteristics corresponding to objects. Accordingly, the color filter of the present invention is expected to be used in a wide range of fields.

EXAMPLES

Hereinafter, the present invention will be described in detail along with examples, however the present invention is not limited to these examples.

Example 1

(Image Forming Material: Production of Pattern Forming Material)

Using a 188 μm-thick corona-treated polyethylene terephthalate film as a substrate, the following composition was coated to the surface of the substrate by a coating bar of rod #10 and dried at 100° C. for 1 minute to form an intermediate layer with a film thickness of 1.6 μm and containing an infrared absorbing agent.

| (Intermediate layer coating composition) | |
| --- | --- |
| Epoxy resin (Epicoat, Yuka-shell Co., Ltd.) | 2 g |
| Infrared absorbent (IR 125 Wako Pure Chemical Industries Ltd.) | 0.2 g |
| 1-methoxy-2-propanol | 9 g |
| methyl ethyl ketone | 9 g |

An image recording layer was formed by surface graft polymerization by plasma treatment of the obtained substrate surface with the intermediate layer under the following conditions.

Using a LCVD-01 model plasma treatment apparatus manufactured by Shimadzu Corporation, a peroxide group was introduced into the intermediate layer surface by 10 second treatment in 0.04 torr argon gas atmosphere and exposure to air. The resulting film was dipped in an aqueous solution containing 10% by weight of sodium α-(styrene-4-sulfonyl)acetate before argon gas bubbling treatment for 15 minutes. The film was heated at 60° C. for 7 hours to carry out graft polymerization. After the graft polymerization, the obtained film was dipped in 3000 ml of ion-exchanged water to remove homopolymer other than graft polymers and thus obtain an image forming material A provided with a grafted image recording layer in the surface by plasma treatment.

(Image Formation: Pattern Formation)

The obtained image forming material A was imagewise exposed by infrared laser (beam diameter of 20 μm) irradiating infrared rays with 830 nm wavelength.

After the exposure, the image forming material A was dipped in an aqueous solution of 0.1% by weight of methylene blue (produced by Wako Pure Chemical Industries Ltd.) for 10 minutes and washed with distilled water to obtain a clear blue image of methylene blue imagewise to the portion selectively exposed by infrared laser.

Example 2

(Image Forming Material: Production of Pattern Forming Material)

A polyethylene terephthalate film extruded biaxially with a thickness of 188 μm which was treated corona (A4100, produced by Toyobo Co., Ltd.), under the following conditions, oxygen glow treatment was carried out for the film using lithographic magnetron sputtering apparatus (CFS-10-EP70, manufactured by Shibaura Eletec Corporation).
Initial vacuum: $9 \times 10^6$ torr
Oxygen pressure: $6.8 \times 10^3$ torr
RF glow: 1.5 kw
Treatment time: 60 sec Next, to the film subjected to glow treatment, a methyl ethyl ketone solution (50% by weight) of the following exemplified monomer (M-1) was coated and dried at 100° C. for 1 minute. The film was irradiated with ultraviolet rays (from a high pressure mercury lamp of 400 W for 30 minutes) to carry out graft polymerization and form a graft layer. Further, an acetonitrile solution of 5% by weight of a photo-thermal conversion pigment (IR-A) with the following structure was coated thereto using a rod bar #7 to add the photo-thermal conversion pigment to the graft layer and thus obtain an image forming material B.

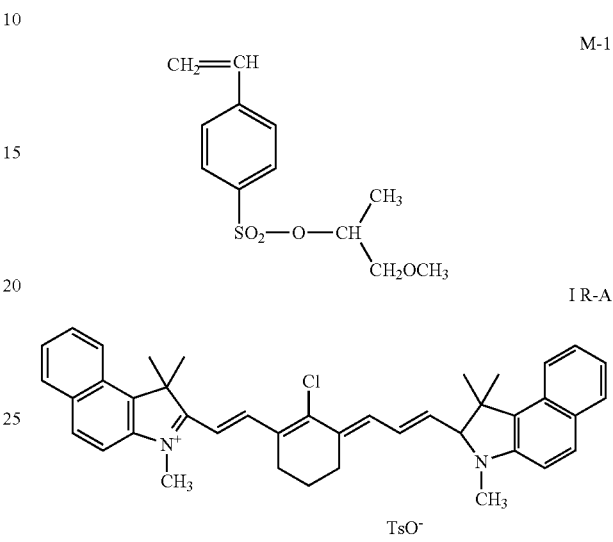

(Image Formation: Pattern Formation)

The obtained image forming material B was imagewise exposed by infrared laser (beam diameter of 20 μm) irradiating infrared rays with 830 nm wavelength.

After the exposure, the image forming material B was dipped in an aqueous solution of 0.1% by weight of methylene blue (produced by Wako Pure Chemical Industries Ltd.) for 10 minutes and washed with distilled water to obtain a clear blue image of methylene blue imagewise to the portion selectively exposed by infrared laser.

Example 3

(Production of Color Filter Master Plate C)

To a 188 μm-thick corona-treated polycarbonate film, the following composition was coated by a coating bar of rod #10 and dried at 100° C. for 1 minute to form a lower layer with a film thickness of 1.6 μm.

| | |
| --- | --- |
| Epoxy resin (Epicoat, Yuka-shell Co., Ltd.) | 2.0 g |
| Infrared absorbing agent (IR 125 Wako Pure Chemical Industries Ltd.) | 0.01 g |
| 1-methoxy-2-propanol | 9 g |
| methyl ethyl ketone | 9 g |

The obtained coating film was subjected to plasma treatment under the following conditions using an LCVD-01 model plasma treatment apparatus manufactured by Shimadzu Corporation. A peroxide group was introduced into the film surface by 20 seconds treatment in 0.05 torr Ar gas atmosphere and exposure to air. The resulting film was dipped in an aqueous solution containing 8% by weight of sodium α-(styrene-4-sulfonyl)acetate before 20 minute-Ar gas bubbling. Then the film was heated at 65° C. for 6 hours to carry out graft polymerization. After the graft polymerization, the obtained film was dipped in 3000 ml of ion-exchanged water to remove homopolymer other than graft polymers and thus obtain a color filter master plate C provided with a grafted polymer in the surface by plasma treatment.

(Production of Color Filter C)

The color filter master plate C obtained in such a manner was exposed in stripe patterns using infrared laser (beam diameter of 20 μm) irradiating infrared rays with 830 nm wavelength.

After the exposure, when the master plate was dipped in a C.I. Basic Blue 45 staining bath to stain the plate, stripe patterns having even blue hue were formed in the portion other than the exposed portion and thus a monochromatic color filter was obtained.

Example 4

(Production of Color Filter Master Plate D)

Using the following electron beam irradiation apparatus for the lower layer similar to that of Example 3, radical was generated on the surface of the film.

Using an electron accelerator (Cascade type IEA-300-25-2 model, manufactured by US RDI Co.), irradiation of electron beam with pressure voltage of 2.0 MV, electron beam current of 1.3 mA was carried out to the coating film. The irradiation atmosphere gas was nitrogen gas. In order to prevent heat generation of the specimen during the irradiation, a conveyer was reciprocated at 2.5 m/min speed. The dose rate was 10 kG/pass and the irradiation dose was 200 kGy.

After that, the obtained electron beam-irradiated film was dipped in an aqueous solution containing 8% by weight of sodium α-(styrene-4-sulfonyl)acetate and heated at 45° C. for 8 hours to carry out graft polymerization. The obtained film was dipped in 5000 ml of ion-exchanged water to remove homopolymer other than graft polymers and thus obtain a negative-type color filter master plate D provided with a grafted polymer in the surface by the electron beam irradiation.

(Production of Color Filter D)

The color filter master plate D obtained in such a manner was exposed in stripe patterns using infrared laser (beam diameter of 20 μm) irradiating infrared rays with 830 nm wavelength.

After the exposure, when the master plate was dipped in a C.I. Basic Blue 45 staining bath to stain the plate, stripe patterns having blue and even hue were formed in the portion other than the exposed portion and thus a monochromatic color filter was obtained.

Example 5

(Production of Color Filter Master Plate E)

Radical was generated on the film surface using the same electron beam irradiation apparatus as that of Example 4 in the same manner except that a low density polyethylene film with a thickness of 200 μm was used as a lower layer (functioning also as a substrate).

Next, a separable flask was filled with 3,000 ml of a methyl ethyl ketone solution of 8% by weight of styrene-4-sulfonate 1-methoxy-2-propanol. The solution was bubbled by Ar gas for 30 minutes. After that, the obtained electron beam-irradiated polyethylene film was dipped in the resulting solution and heated at 40° C. for 15 hours to carry out graft polymerization. The obtained film after the graft polymerization was dipped in 5,000 ml of methyl ethyl ketone to remove homopolymer other than graft polymers and thus obtain a color filter master plate E provided with a grafted polymer in the surface by the electron beam irradiation.

(Production of Color Filter E)

The color filter master plate E previously arranged a pattern of 50 μm×150 μm by a black matrix with a line width of 15 μm, was printed in stripe patterns by a thermal head. After that, the master plate E was dipped in a C.I. Basic Blue 45 staining bath to stain the patterns to blue.

In the same manner, green and red stripe patterns were printed by the thermal head and stained. A multi-color filter having three hues in the one substrate and being even was obtained. The dye used for the green patterns was C.I. Basic Green 4 and the dye used for the red patterns was C.I. Basic Red 18.

Example 6

(Production of Color filter Master Plate F)

A color filter master plate F was obtained in the same manner as Example 5, except that 2-ethoxyethyl acrylate (A-EE, produced by Shin-Nakamura Chemical Co., Ltd.) was used in place of styrene-4-sulfonate1-methoxy-2-propanol used for graft polymerization in Example 5.

(Production of Color Filter F)

The color filter master plate F was printed in stripe patterns by a thermal head. After the printing, the master plate was dipped in a C.I. Basic Blue 45 bath and stained to obtain a monochromatic color filter having stripe patterns with blue and even hue in the exposed portion.

Example 7

(Production of Color Filter Master Plate G)

Radical was generated on a crosslinked film type hydrophilic polymer film surface by the same electron beam irradiation apparatus in the same manner as Example 4, except that the following crosslinked film type hydrophilic polymer layer was employed as the lower layer.

Production of the Lower Layer:

Production of Hydrophilic Polymer

Polyacrylic acid (molecular weight of 25,000, Wako Pure Chemical Industries Ltd.) of 20.0 g was dissolved dimethylacetamide and mixed with 6.0 g of 2-methacryloyloxyethyl isocyanate (hereinafter abbreviated as MOI) and 0.13 g of dibutyl tin dilaurate and reacted for 3 hours. After that, 80% by equivalent of carboxyl groups were partially neutralized with sodium hydroxide and the polymer was precipitated by adding acetone and washed well to obtain a refined hydrophilic polymer P-1.

1.0 g of the hydrophilic polymer (P-1), 0.1 g of a water-soluble triazine initiator A with the following structure, and 0.03 g of a photo-thermal conversion pigment B with the following structure were dissolved in 20 g of water. The obtained solution was coated to a 200 μm-thick and corona-treated PET by a wire bar #14. The layer was dried at 100° C. for 1 minute and exposed by ultraviolet rays in the entire surface in 1,000 counts (Eye Rotary Printer, manufactured by Eye Graphics Co., LTD.) to form a cross-linked hydrophilic layer. The thickness of the hydrophilic layer was 3.5 µm.

Water-soluble Triazine Initiator A

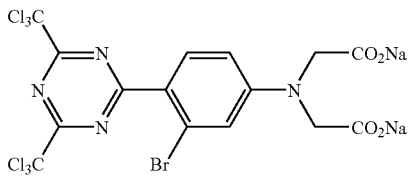

Photo-thermal Conversion Pigment B

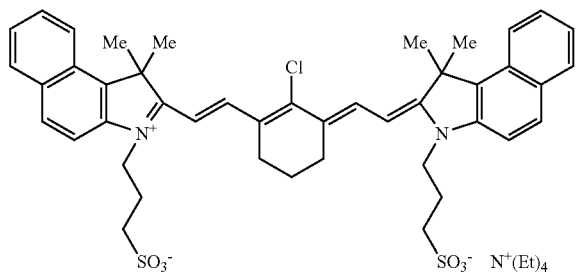

Next, radical was generated on the hydrophilic polymer surface by electron beam irradiation in the same manner as Example 5. The graft polymerization was carried out in the same manner as Example 5 using styrene-4-sulfonate 1-methoxy-2-propanol to obtain a color filter master plate G having the graft polymer in the surface by electron beam irradiation.

(Production of Color Filter G)

The color filter master plate G obtained in such a manner was exposed in stripe patterns by infrared laser (beam diameter of 20 µm) irradiating infrared rays with 830 nm wavelength.

After the exposure, the master plate G was dipped in a C.I. Basic Blue 45 bath and stained to obtain a monochromatic color filter having stripe patterns with blue and even hue in the exposed portion.

Example 8

A polyethylene terephthalate film extruded biaxially with a thickness of 188 µm as a lower layer (functioning also as a substrate) (A4100, Toyobo Co., Ltd.) was treated with oxygen glow by a lithographic magnetron sputtering apparatus (CFS-10-EP70, manufactured by Shibaura Eletec Corporation) under the following conditions.

Initial vacuum: $9 \times 10^6$ torr
Oxygen pressure: $6.8 \times 10^3$ torr
RF glow: 1.5 kw
Treatment time: 60 sec Next, the film subjected to glow treatment was dipped in 50% by weight of styrene-4-sulfonate 1-methoxy-2-propanol (M-5) in methyl ethyl ketone and heated at 60° C. for 4 hours to carry out graft polymerization. Thus, a color filter master plate H having the graft polymer in the surface was obtained.

(Production of Color Filter H)

The color filter master plate H was printed in stripe patterns by a thermal head. After the printing, the master plate was dipped in a C.I. Basic Blue 45 bath and stained to obtain a monochromatic color filter having stripe patterns with blue and even hue in the exposed portion.

In examples 3, 4 and 6 to 8 among the examples, in the case C.I. Basic Green 4 was used in place of the C.I. Basic Blue 45 which is a dye used for forming monochromatic color filters, monochromatic color filters having stripe patterns with green and even hue were obtained, and in the case C.I. Basic Red 18 was used in place of the C.I. Basic Blue 45, monochromatic color filters having stripe patterns with red and even hue were obtained, respectively.

The image forming material of the present invention is excellent to form an image with a high sensitivity by exposure and heating and give an image with a high resolution and sharpness regardless of the surface area of the image forming material. It is also possible to form directly image based on digital data by operation of infrared laser and thus the image forming material is expected to be usable in a wide range of fields.

The color filter master plate of the present invention is possible to form optional patterns of pixels and black matrix directly from digital data using simple and compact heat sensitive printers such as infrared irradiating laser and word processors or various kinds of thermal heads such as heat sensitive facsimiles or the like. Also it is easy to produce a color filter having pixels with fine and even hue and multi-color constitution in a single plane, that is, an even thin film. Further, the color filter using the color filter master plate is excellent to form pixels and black matrix with a plurality of hue and fine and even hue in a single plane.

What is claimed is:

1. A method of producing a color filter, comprising the steps of:

preparing a color filter master plate comprising a recording layer comprising a polymer compound containing a polarity conversion group with a polarity character thereof being changeable by heat or irradiation;

exposing, by heating or light-beam irradiation, the color filter master plate, thereby changing the polarity character of a surface of the recording layer; and causing a dye or a pigment to be adsorbed at regions of the surface of the recording layer where the polarity character has been changed, wherein the polarity conversion group is represented by at least one of the following general formulae (1) or (3):

General Formula (1)

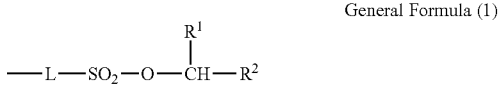

in which L represents an organic group comprising a multivalent non-metal atom necessary for bonding to a polymer skeleton, $R^1$ and $R^2$ each independently represent a substituted or unsubstituted alkyl group, and $R^1$ and $R^2$ may form a ring with a secondary carbon atom, represented by CH, bonded thereto,

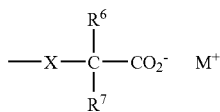

General Formula (3)

in which X represents a group selected from among —O—, —S—, —Se—, —N⁸—, —CO—, —SO—, —SO$_2$—, —PO—, —SiR⁸R⁹—, and —CS—; R⁶, R⁷, R⁸, and R⁹ each independently represents a monovalent group; and M represents a positively charged ion.

2. The method of producing a color filter of claim 1, wherein the polymer compound is either a straight chain polymer compound directly bonded to a surface of a substrate by chemical bonding at a terminal of the polymer chain, or a straight chain polymer compound bonded to the surface of the substrate by chemical bonding via a main chain polymer compound at a terminal of the polymer chain.

3. The method of producing a color filter of claim 2, wherein the chemical bonding is carbon-carbon covalent.

4. The method of producing a color filter of claim 1, wherein the polarity conversion group is represented by the following general formula (1):

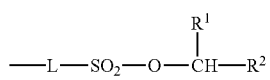

General Formula (1)

in which L represents an organic group comprising a multivalent non-metal atom necessary for bonding to a polymer skeleton, R¹ and R² each independently represent a substituted or unsubstituted alkyl group, and R¹ and R² may form a ring with a secondary carbon atom, represented by CH, bonded thereto.

5. The method of producing a color filter of claim 1, wherein the polarity conversion group is represented by the following general formula (3):

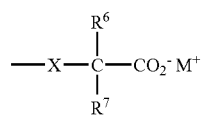

General Formula (3)

in which X represents a group selected from among —O—, —S—, —Se—, —NR⁸—, —CO—, —SO—, —SO$_2$—, —PO—, —SiR⁸R⁹—, and —CS—; R⁶, R⁷, R⁸, and R⁹ each independently represents a monovalent group; and M represents a positively charged ion.

6. The method of producing a color filter of claim 1, wherein the color filter master plate further comprises a photo-thermal conversion substance.

7. A color filter produced by a method comprising the steps of:
heating or irradiating a color filter master plate comprising a recording layer containing a polymer compound having a functional group with a hydrophilic/hydrophobic character thereof being changeable by heat, or irradiation;
changing the hydrophilic/hydrophobic character of a surface of the recording layer; and
causing a dye or a pigment to be adsorbed at regions thereof where the hydrophilic/hydrophobic character has been changed,
wherein the functional group is represented by at least one of the following general formula (1) or (3):

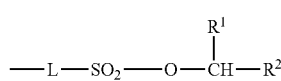

General Formula (1)

in which L represents an organic group comprising a multivalent non-metal atom necessary for bonding to a polymer skeleton, R¹ and R² each independently represent a substituted or unsubstituted alkyl group, and R¹ and R² may form a ring with a secondary carbon atom, represented by CH, bonded thereto,

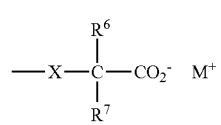

General Formula (3)

in which X represents a group selected from among —O—, —S—, —Se—, —NR⁸—, —CO—, —SO—, —SO$_2$—, —PO—, —SiR⁸R⁹—, and —CS—; R⁶, R⁷, R⁸, and R⁹ each independently represents a monovalent group; and M represents a positively charged ion.

* * * * *